United States Patent
Selle et al.

(10) Patent No.: US 10,210,287 B2
(45) Date of Patent: Feb. 19, 2019

(54) AUGMENTED MATERIAL POINT METHOD FOR SIMULATING PHASE CHANGES AND VARIED MATERIALS

(71) Applicant: Disney Enterprises, Inc., Burbank, CA (US)

(72) Inventors: Andrew Selle, Burbank, CA (US);
Joseph Teran, Burbank, CA (US);
Alexey Stomakhin, Burbank, CA (US)

(73) Assignee: Disney Enterprises, Inc., Burbank, CA (US)

( * ) Notice: Subject to any disclaimer, the term of this patent is extended or adjusted under 35 U.S.C. 154(b) by 488 days.

(21) Appl. No.: 14/323,798

(22) Filed: Jul. 3, 2014

(65) Prior Publication Data

US 2015/0186565 A1  Jul. 2, 2015

Related U.S. Application Data

(63) Continuation-in-part of application No. 14/257,044, filed on Apr. 21, 2014, now Pat. No. 10,019,827.

(60) Provisional application No. 61/922,602, filed on Dec. 31, 2013.

(51) Int. Cl.
 *G06F 17/50* (2006.01)
(52) U.S. Cl.
 CPC .............................. *G06F 17/5009* (2013.01)
(58) Field of Classification Search
 CPC .................................................. G06F 17/5009
 See application file for complete search history.

(56) References Cited

U.S. PATENT DOCUMENTS

| | | | |
|---|---|---|---|
| 6,456,289 B1 | 9/2002 | O'Brien et al. | |
| 6,456,293 B1 | 9/2002 | Grandy | |
| 8,204,725 B1 * | 6/2012 | Thuerey | G06T 13/60 345/473 |
| 9,285,293 B2 | 3/2016 | Seta et al. | |

(Continued)

OTHER PUBLICATIONS

Barbara Solenthaler et al., A unified particle model for fluid-solid interactions, Wiley InterScience, Comp. Anim. Virtual Worlds 2007; 18: 69-82.*

(Continued)

*Primary Examiner* — Aniss Chad
*Assistant Examiner* — Justin C Mikowski
(74) *Attorney, Agent, or Firm* — Patterson + Sheridan, LLP (57) ABSTRACT

The disclosure provides an approach for simulating and rendering materials across different states and undergoing phase transitions. In one configuration, a simulation application generates video frames depicting a material phenomenon using an augmented material point method (MPM). Traditional MPM does not handle incompressible materials such as fluids. Techniques disclosed herein augment the MPM with a Chorin-style projection technique to enable simulation of arbitrarily incompressible materials. In one configuration, this is achieved with a marker-and-cell (MAC) grid based MPM solver, a splitting of stress used in the simulation into elastic and dilational parts, a projection-like implicit treatment of the Eulerian evolution of the dilational part of the stress, and particular techniques for rasterizing and updating quantities on the MAC grid. In addition, a heat model may be coupled to the MPM solver, allowing material changes to be driven with temperature and phase changes.

18 Claims, 4 Drawing Sheets

(56) References Cited

U.S. PATENT DOCUMENTS

| | | | |
|---|---|---|---|
| 2010/0049489 A1 | 2/2010 | Tanaka | |
| 2010/0292965 A1* | 11/2010 | Yilbas | G06F 17/5009 703/2 |
| 2012/0053908 A1* | 3/2012 | Kim | G06F 17/5009 703/2 |
| 2012/0095741 A1 | 4/2012 | Jin et al. | |
| 2012/0253756 A1 | 10/2012 | Favier | |
| 2013/0127874 A1 | 5/2013 | Peterson | |
| 2014/0214377 A1* | 7/2014 | Kazama | G06F 17/5009 703/2 |
| 2014/0309971 A1* | 10/2014 | Ueno | G06F 19/701 703/2 |
| 2015/0161305 A1* | 6/2015 | Kazama | G06F 17/5009 703/9 |
| 2015/0213163 A1 | 7/2015 | Yang et al. | |

OTHER PUBLICATIONS

P.C. Wallstedt et al., An evaluation of explicit time integration schemes for use with the generalized interpolation material point method, Elsevier Ltd, Journal of Computational Physics 227 (2008) 9628-9642.*

Guilkey et. al., Implicit time integration for the material point method: Quantitative and algorithmic comparisons with the finite element method, Int. J. Numer. Meth. Engng 2003; 57:1323-1338.*

Allen R. York et. al., The Material Point Method for Simulation of Thin Membranes, Int. J. Numer. Meth. Engng. 44, 1429Đ1456 (1999).*

Alduán, I., and Otaduy, M. 2011. SPH granular flow with friction and cohesion. In Proc. of the 2011 ACM SIGGRAPH/Eurographics Symp. on Comp. Anim., 25-32.

Alduán, I., Tena, A., and Otaduy, M. 2009. Simulation of high-resolution granular media. In Proc. of Congreso Español de Informática Gráfica, vol. 1.

Bargteil, A., Wojtan, C., Hodgins, J., and Turk, G. 2007. A finite element method for animating large viscoplastic flow. In ACM Trans. on Graph., vol. 26, 16.

Bell, N., Yu, Y., and Mucha, P. 2005. Particle-based simulation of granular materials. In Proc. of the 2005 ACM SIGGRAPH/Eurographics symposium on Comp. animation, 77-86.

Brown, R. 1980. A volumetric constitutive law for snow based on a neck growth model. J. of Appl. Phys. 51, 1, 161-165.

Chanclou, B., Luciani, A., and Habibi, A. 1996. Physical models of loose soils dynamically marked by a moving object. In Comp. Anim.'96. Proc., 27-35.

Chao, I., Pinkall, U., Sanan, P., and Schröder, P. 2010. A simple geometric model for elastic deformations. ACM Trans. on Graph. 29, 4, 38.

Cresseri, S., and Jommi, C. 2005. Snow as an elastic viscoplastic bonded continuum: a modelling approach. Italian Geotechnical J. 4, 43-58.

Cresseri, S., Genna, F., and Jommi, C. 2010. Numerical integration of an elastic-viscoplastic constitutive model for dry metamorphosed snow. Intl. J. for Num. and Anal. Meth. in geomechanics 34, 12, 1271-1296.

Dutykh, D., Acary-Robert, C., and Bresch, D. 2011. Mathematical modeling of powder-snow avalanche flows. Studies in Appl. Math. 127, 1, 38-66.

Fearing, P. 2000. Computer modelling of fallen snow. In Proc. of the 27th annual conf. on Comp. Graph. and interactive techniques, 37-46.

Feldman, B., and O'Brien, J. 2002. Modeling the accumulation of wind-driven snow. In ACM SIGGRAPH 2002 conf. abstracts and applications, 218-218.

Goktekin, T., Bargteil, A., and O'Brien, J. 2004. A method for animating viscoelastic fluids. In ACM Trans. on Graph., vol. 23, 463-468.

Gray, D., and Male, D. 1981. Handbook of snow: principles, processes, management & use. Pergamon Press.

Ihmsen, M., Wahl, A., and Teschner, M. 2012. Highresolution simulation of granular material with SPH. In Workshop on Virtual Reality Interaction and Phys. Sim., 53-60.

Irving, G., Teran, J., and Fedkiw, R. 2004. Invertible finite elements for robust simulation of large deformation. In Proc. of the 2004 ACM SIGGRAPH/Eurographics symposium on Comp. animation, 131-140.

Keiser, R., Adams, B., Gasser, D., Bazzi, P., Dutré, P., and Gross, M. 2005. A unified lagrangian approach to solid-fluid animation. In Point-Based Graph., 2005. Eurographics/IEEE VGTC Symp. Proc., 125-148.

Kim, T., and Lin, M. 2003. Visual simulation of ice crystal growth. In Proc 2003 ACM SIGGRAPH/Eurographics Symp. Comput. Anim., 86-97.

Kim, T., Adalsteinsson, D., and Lin, M. 2006. Modeling ice dynamics as a thin-film Stefan problem. In Proc. 2006 ACM SIGGRAPH/Eurographics Symp. Comput. Anim., 167-176.

Luciani, A., Habibi, A., and Manzotti, E. 1995. A multiscale physical model of granular materials. In Graphics Interface, 136-136.

Marechal, N., Guerin, E., Galin, E., Merillou, S., and Merillou, N. 2010. Heat transfer simulation for modeling realistic winter sceneries. Comp. Graph. Forum 29, 2, 449-458.

McAdams, A., Selle, A., Ward, K., Sifakis, E., and Teran, J. 2009. Detail preserving continuum simulation of straight hair. ACM Trans. on Graphics 28, 3, 62.

Meschke, G., Liu, C., and Mang, H. 1996. Large strain finite-element analysis of snow. J. of Engng. Mech. 122, 7, 591-602.

Milenkovic, V. 1996. Position-based physics: simulating the motion of many highly interacting spheres and polyhedra. In Proc. of the 23rd annual conf. on Comp. Graph. and interactive techniques, 129-136.

Miller, G., and Pearce, A. 1989. Globular dynamics: A connected particle system for animating viscous fluids. Comp. & Graph. 13, 3, 305-309.

Narain, R., Golas, A., and Lin, M. 2010. Free-flowing granular materials with two-way solid coupling. In ACM Trans. on Graph., vol. 29, 173.

Nicot, F. 2004. Constitutive modelling of snow as a cohesive-granular material. Granular Matter 6, 1, 47-60.

Nishita, T., Iwasaki, H., Dobashi, Y., and Nakamae, E. 1997. A modeling and rendering method for snow by using metaballs. In Comp. Graph. Forum, vol. 16, C357-C364.

O'Brien, J., Bargteil, A., and Hodgins, J. 2002. Graphical modeling and animation of ductile fracute. ACM Trans. on Graph. 21, 3, 291-294.

Pauly, M., Keiser, R., Adams, B., Dutré, P., Gross, M., and Guibas, L. 2005. Meshless animation of fracturing solids. In ACM Trans. on Graph., vol. 24, 957-964.

Pla-Castells, M., García-Fernández, I., and Martínez, R. 2006. Interactive terrain simulation and force distribution models in sand piles. Cellular Automata, 392-401.

St Lawrence, W., and Bradley, C. 1975. The deformation of snow in terms of structural mechanism. In Snow Mech. Symp., 155.

Stomakhin, A., Howes, R., Schroeder, C., and Teran, J. 2012. Energetically consistent invertible elasticity. In Eurographics/ACM SIGGRAPH Symp. on Comp. Anim., 25-32.

Sumner, R., O'Brien, J., and Hodgins, J. 1999. Animating sand, mud, and snow. In Comp. Graph. Forum, vol. 18, 17-26.

Terzopoulos, D., and Fleischer, W. 1988. Modeling inelastic deformation: viscoelasticity, plasticity, fracture. Proc. ACM SIGGRAPH 1988 22, 4, 269-278.

Wojtan, C., and Turk, G. 2008. Fast viscoelastic behavior with thin features. In ACM Trans. on Graph., vol. 27, 47.

Zhu, Y., and Bridson, R. 2005. Animating sand as a fluid. ACM Trans. on Graph. 24, 3, 965-972.

Zhu, B., and Yang, X. 2010. Animating sand as a surface flow. Eurographics 2010, Short Papers.

U.S. Appl. No. 14/257,044, entitled "Material Point Method for Simulation of Granular Materials", filed Apr. 21, 2014.

Yao, Yang-Ping, Haruyuki Yamamoto, and Nai-Dong Wang. "Constitutive model considering sand crushing." Soils and foundations 48.4 (2008): 603-608.

(56) References Cited

OTHER PUBLICATIONS

Andersen, Soren, and Lars Andersen. "Modelling of landslides with the material-point method." Computational Geosciences 14.1(2010):137-147.

O'brien, James F., and Jessica K. Hodgins. "Graphical modeling and animation of brittle fracture." Proceedings of the 26th annual conference on Computer graphics and interactive techniques. ACM Press/Addison-Wesley Publishing Co., 1999.

El Youssoufi, Moulay Sa"id, J-Y. Delenne, and Farhang Radjai. "Self-stresses and crack formation by particle swelling in cohesive granular media." Physical Review E 71.5 (2005): 051307.

McDowell, G. R., M. D. Bolton, and D. Robertson. "The fractal crushing of granular materials." Journal of the Mechanics and Physics of Solids 44.12 (1996): 2079-2101.

Seta, E., T. Kamegawa, and Y. Nakajima. "Prediction of snow/tire interaction using explicit FEM and FVM." Tire Science and Technology31.3 (2003): 173-188.

Chanclou, Benoit, Annie Luciani, and Arash Habibi. "Physical models of loose soils dynamically marked by a moving object." Computer Animation'96. Proceedings. IEEE, 1996.

Batty, C., and Bridson, R. 2008. Accurate viscous free surfaces for buckling, coiling, and rotating liquids. In Proc 2008 ACM/Eurographics Symp Comp Anim, 219-228.

Becker, M., Ihmsen, M., and Teschner, M. 2009. Corotated sph for deformable solids. In Eurographics Conf. Nat. Phen., 27-34.

Bonet, J., and Wood, R. 1997. Nonlinear Continuum Mechanics for Finite Element Analysis. Cambridge University Press.

Carlson, M., Mucha, P. J., Van Horn, III, R. B., and Turk, G. 2002. Melting and flowing. In ACM SIGGRAPH/Eurographics Symp. Comp. Anim., 167-174.

Carlson, M., Mucha, P., and Turk, G. 2004. Rigid fluid: animating the interplay between rigid bodies and fluid. In ACM Trans. on Graph., vol. 23, 377-384.

Chang, Y., Bao, K., Liu, Y., Zhu, J., and Wu, E. 2009. A particle-based method for viscoelastic fluids animation. In ACM Symp. Virt. Real. Soft. Tech., 111-117. [Abstract Only].

Chentanez, N., Goktekin, T. G., Feldman, B. E., and O'Brien, J. F. 2006. Simultaneous coupling of fluids and deformable bodies. In ACM SIGGRAPH/Eurographics Symposium on Computer Animation, 83-89.

Clausen, P., Wicke, M., Shewchuk, J. R., and O'Brien, J. F. 2013. Simulating liquids and solid-liquid interactions with lagrangian meshes. ACM Trans. Graph. 32, 2, 17:1-17:15.

Dagenais, F., Gagnon, J., and Paquette, E. 2012. A prediction-correction approach for stable sph fluid simulation from liquid to rigid. In Proc. of Comp. Graph. Intl.

Desbrun, M., and Gascuel, M.-P. 1996. Smoothed particles: A new paradigm for animating highly deformable bodies. In Eurographics Workshop Comp. Anim. Sim., 61-76.

Gonzalez, O., and Stuart, A. 2008. A First Course in Continuum Mechanics. Cambridge texts in applied mathematics. Cambridge University Press.

Harlow, F., and Welch, E. 1965. Numerical calculation of time-dependent viscous incompressible flow of fluid with free surface. Phys Fl 8, 2182. [Abstract Only].

Hirt, C., and Shannon, J. 1968. Free-surface stress conditions for incompressible-flow calculations. JCP 2, 4, 403-411.

Iwasaki, K., Uchida, H., Dobashi, Y., and Nishita, T. 2010. Fast particle-based visual simulation of ice melting. Comp. Graph. Forum 29, 7, 2215-2223.

Kwatra, N., Su, J., Gretarsson, J., and Fedkiw, R. 2009. A method for avoiding the acoustic time-step restriction in compressible flow. J. Comp. Phys. 228, 4146-4161.

Lenaerts, T., and Dutre, P. 2009. Mixing fluids and granular materials. Comp. Graph. Forum 28, 2, 213-218.

Lii, S.-Y., and Wong, S.-K. 2013. Ice melting simulation with water flow handling. Vis. Comp., 1-8.

Losasso, F., Irving, G., Guendelman, E., and Fedkiw, R. 2006. Melting and burning solids into liquids and gases. IEEE Trans. Vis. Comp. Graph. 12, 343-352. [Abstract Only].

Losasso, F., Shinar, T., Selle, A., and Fedkiw, R. 2006. Multiple interacting liquids. ACM Trans. Graph. 25, 3, 812-819.

Martin, S., Kaufmann, P., Botsch, M., Grinspun, E., and Gross, M. 2010. Unified simulation of elastic rods, shells, and solids. ACM Trans. Graph. 29, 4 (Jul.), 39:1-39:10.

Mast, C., Mackenzie-Helnwein, P., Arduino, P., Miller, G., and Shin, W. 2012. Mitigating kinematic locking in the material point method. J. Comp. Phys. 231, 16, 5351-5373. [Abstract Only].

Huller, M., Keiser, R., Nealen, A., Pauly, M., Gross, M., and Alexa, M. 2004. Point based animation of elastic, plastic and melting objects. In ACM SIGGRAPH/Eurographics Symp. Comp. Anim., 141-151.

Muller, M., Heidelberger, B., Teschner, M., and Gross, M. 2005. Meshless deformations based on shape matching. ACM Trans. Graph. 24, 3, 471-478.

Paiva, A., Petronetto, F., Lewiner, T., and Tavares, G. 2006. Particle-based non-newtonian fluid animation for melting objects. In Conf. Graph. Patt. Images, 78-85.

Paiva, A., Petronetto, F., Lewiner, T., and Tavares, G. 2009. Particle-based viscoplastic fluid/solid simulation. Comp. Aided Des. 41, 4, 306-314.

Rasmussen, N., Enright, D., Nguyen, D., Marino, S., Sumner, N., Geiger, W., Hoon, S., and Fedkiw, R. 2004. Directable photorealistic liquids. In ACM SIGGRAPH/Eurographics Symp. Comp. Anim., 193-202.

Robinson-Mosher, A., Shinar, T., Gretarsson, J., Su, J., and Fedkiw, R. 2008. Two-way coupling of fluids to rigid and deformable solids and shells. ACM Trans. Graph. 27, 3 (Aug.), 46:1-46:9.

Solenthaler, B., Schl-Afli, J., and Pajarola, R. 2007. A unified particle model for fluid-solid interactions: Research articles. Comp. Anim. Virt. Worlds 18, 1, 69-82.

Steffen, M., Kirby, R., and Berzins, M. 2008. Analysis and reduction of quadrature errors in the material point method (MPM). Int. J. Numer. Meth. Engng 76, 6, 922-948.

Stomakhin, A., Schroeder, C., Chai, L., Teran, J., and Selle, A. 2013. A material point method for snow simulation. ACM Trans. Graph. 32, 4 (Jul.), 102:1-102:10.

Stora, D., Agliati, P.-O., Cani, M.-P., Neyret, F., and Gascuel, J.-D. 1999. Animating lava flows. In Graph. Int., 203-210.

Sulsky, D., Zhou, S.-J., and Schreyer, H. 1995. Application of particle-in-cell method to solid mechanics. Comp. Phys. Comm. 87, 236-252.

Terzopoulos, D., Platt, J., and Fleischer, K. 1991. Heating and melting deformable models. J. Vis. Comp. Anim. 2, 2, 68-73.

Teschner, M., Heidelberger, B., Muller, M., and Gross, M. 2004. A versatile and robust model for geometrically complex deformable solids. In Comp. Graph. Int., 312-319.

Wei, X., Li, W., and Kaufman, A. 2003. Melting and flowing of viscous volumes. In Intl. Conf. Comp. Anim. Social Agents, 54-60.

Wojtan, C., Carlson, M., Mucha, P. J., and Turk, G. 2007. Animating corrosion and erosion. In Eurographics Conf. Nat. Phen., 15-22. [Abstract Only].

Yu, J., and Turk, G. 2010. Reconstructing surfaces of particle-based fluids using anisotropic kernels. In Proceedings of the 2010 ACM SIGGRAPH/Eurographics Symposium on Computer Animation, Eurographics Association, 217-225.

Zhao, Y., Wang, L., Qiu, F., Kaufman, A., and Mueller, K 2006. Melting and flowing in multiphase environment. Comp. Graph. 30, 2006. [Abstract Only].

Zhu, Y. and Bridson, R. 2005. Animating sand as a fluid.ACM Trans. on Graph. 24, 3, pp. 965-972.

* cited by examiner

AUGMENTED MATERIAL POINT METHOD FOR SIMULATING PHASE CHANGES AND VARIED MATERIALS

CROSS-REFERENCE TO RELATED APPLICATIONS

This application is a continuation-in-part of co-pending U.S. patent application Ser. No. 14/257,044, entitled "Material Point Method for Simulation of Granular Materials" and filed Apr. 21, 2014, which claims benefit of U.S. provisional patent application Ser. No. 61/922,602, filed Dec. 31, 2013. Each of the aforementioned related patent applications is herein incorporated by reference.

BACKGROUND

Field

This disclosure provides techniques for simulating and rendering materials in computer animation.

Description of the Related Art

In computer animation physics engines, "solvers" are used to simulate physical behavior of objects (e.g., the physical response of an object to a collision with another object). These solvers typically employ numerical techniques to approximate the physics so that simulations can be efficiently performed on a computer. Specialized solvers have been used to simulate a variety of phenomena in graphics and computational physics. Such solvers include fluid simulators, rigid body simulators, and cloth simulators, among others, each of which is suited to simulate behavior of a particular type of material. For example, fluid simulators are suited for simulating liquids which deform with no memory, while rigid body simulators are suited for simulating destruction and debris where there is no deformation (e.g., glass shattering).

Such traditional simulators have difficulty simulating materials across different states and undergoing phase transitions, such as ice melting into water, lava solidifying into pāhoehoe, butter melting in a pan, and the like. The difficulty lies in achieving robust, accurate, and efficient simulation of a wide variety of material behaviors without requiring overly complex implementations. Explicit coupling between solid and fluid solvers has been proposed, but such coupling typically requires complex implementation and has significant computation costs.

SUMMARY

This disclosure presents an augmented material point method for simulating phase changes and varied materials. One aspect of this disclosure provides a computer-implemented method which generally includes transferring states of particles representing the material to a grid, and determining an intermediate velocity field using a material point method computation, where the material point method computation discretizes deviatoric forces that affect the material. The method further includes applying a projection over the grid to obtain a projected velocity field from the intermediate velocity field, where the projection discretizes dilational forces that affect the material. In addition, the steps include updating the states of one or more of the particles based on at least the projected velocity field.

Other aspects include, without limitation, a computer-readable medium that includes instructions that enable a processing unit to implement one or more aspects of the disclosed method, as well as a system configured to implement one or more aspects of the disclosed method.

BRIEF DESCRIPTION OF THE DRAWINGS

So that the manner in which the above recited aspects are attained and can be understood in detail, a more particular description of aspects of the disclosure, briefly summarized above, may be had by reference to the appended drawings. It is to be noted, however, that the appended drawings illustrate only typical aspects of this disclosure and are therefore not to be considered limiting of its scope, for the disclosure may admit to other equally effective aspects.

DETAILED DESCRIPTION

This disclosure provides techniques for simulating and rendering materials across different states and undergoing phase transitions. In one configuration, a simulation application generates video frames depicting a material phenomenon using an augmented material point method (MPM). The MPM is a numerical procedure which allows simulations to be performed on a computer, and MPM augments particles used to simulate materials with a transient Eulerian grid for more efficient computing of derivatives and other quantities. While MPM can be used to simulate a wide range of material behaviors, traditional MPM does not handle incompressible materials such as fluids. As a result, traditional MPM cannot simulate materials in both solid and liquid states and the phase change between such states. In contrast, techniques disclosed herein permit such simulations, including simulations of phenomena such as ice melting into water, lava solidifying into pāhoehoe, butter melting in a pan, and the like. In particular, such simulations are made possible by augmenting traditional MPM with a Chorin-style projection technique which enables both simulation of arbitrarily incompressible materials such as fluids and simulation of other materials and behaviors that MPM provides. In one configuration, this is achieved with a marker-and-cell (MAC) grid based MPM solver, a splitting of stress used in the simulation into deviatoric and dilational parts, an MPM treatment of the deviatoric part, a projection-like implicit treatment of the Eulerian evolution of the dilational part, and particular techniques for rasterizing and updating quantities on the MAC grid. In essence, the MPM solver is combined with an incompressible Fluid-Implicit Particle (FLIP) solver in a computationally efficient manner.

Figure 1:
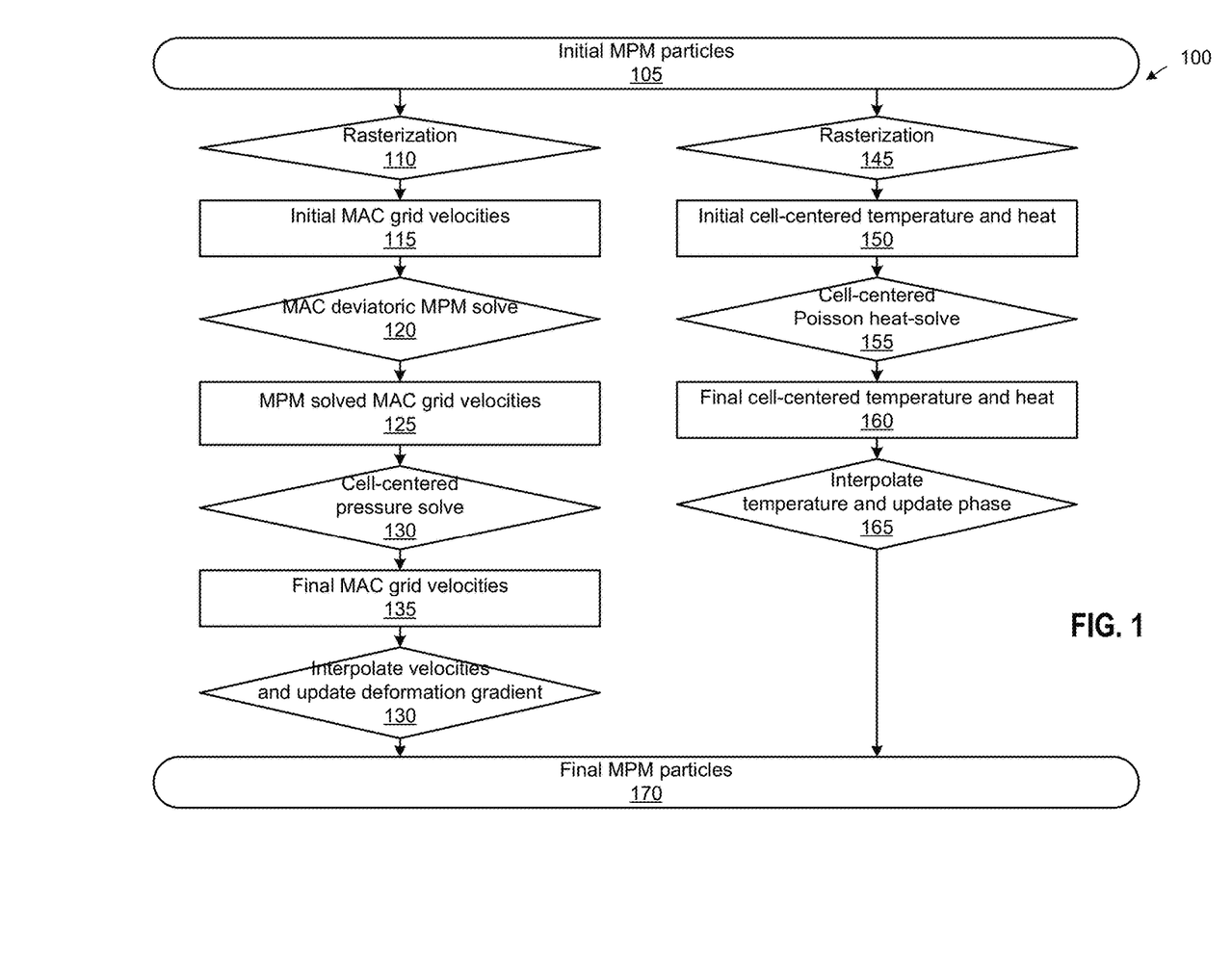
FIG. 1 illustrates, at a high level, a time step of an augmented material point method for simulating a material across multiple states and phase transitions, according to an aspect of this disclosure.

FIG. 1 illustrates, at a high level, a time step of an augmented material point method 100 for simulating materials across multiple states and phase transitions, according to an aspect of this disclosure. In each time step, a simulation application updates states of particles, which represent the material, from time $t^n$ to time $t^{n+1}$. The simulation application first transfers the particle states, including velocities, to a MAC grid by mass weighted rasterization (inverse mass weighted rasterization for Lamé parameter $\lambda$) of properties of the particles at cell centers and faces of the MAC grid, and the simulation application then performs an implicit MPM computation to update the velocities. Here, the MPM is used to discretize deviatoric (i.e., sheer) forces. Further, the simulation application performs a Chorin-style projection to discretize dilational (i.e., mean volumetric or spherical) forces, thereby giving the MPM updated velocities a pressure correction. The Chorin-style projection is used to solve for problematic stresses that would otherwise cause MPM locking when the elastic response is taken to the incompressible limit, and the combination of the implicit MPM computation and the Chorin-style projection results in a MAC-style staggered MPM procedure. It should be understood that a deviatoric/dilational splitting of the constitutive model allows for the MPM and Chorin-style projection to act on different parts of model and synergistically facilitates arbitrary variation of the material from compressible to incompressible. Further, sharp phase transitions benefit from constitutive model splitting since this prevents energy gain when transitioning from fluid to solid. A heat model is also coupled to the MPM solver, allowing material changes to be driven with temperature and phase changes. For example, materials tend to become more liquid-like as temperature rises. To model such an effect, the simulation application may solve a heat equation on the background MPM grid and use the resulting temperature and phase to vary material properties such as Young's modules and Poisson ratio such that the material becomes softer or stiffer, among other things. This additional heat equation solve may be performed at each time step.

Illustratively, the method 100 begins with initial particles 105 at a given time step, and a simulation application rasterizes particle states to a MAC grid at 110 to obtain initial grid velocities. In one configuration, the particle states rasterized to the grid may include values for the properties listed in Table 1. A particular technique for rasterizing particle states to the MAC grid is discussed in greater detail below.

TABLE 1

| Notation | Description | Is Constant |
| --- | --- | --- |
| $x_p$ | Position | Not constant |
| $v_p$ | Velocity | Not constant |
| $m_p$ | Mass | Constant |
| $V_p^0$ | Initial volume | Constant |
| $F_{E_p}$ | Elastic part of $F_P$ | Not constant |
| $F_{P_p}$ | Plastic part of $F_P$ | Not constant |
| $\mu_p$ | Lamé parameter $\mu$ | Depends on $T_p$ and phase |
| $\lambda_p$ | Lamé parameter $\lambda$ | Depends on $T_p$ but not phase |
| $T_p$ | Temperature | Not constant |
| $U_p$ | Transition heat | Not constant |
| $c_p$ | Heat capacity per unit mass | Depends on $T_p$ and phase |
| $k_p$ | Heat conductivity | Depends on $T_p$ and phase |
| $L_p$ | Latent heat | Constant |
| $\zeta_p$ | Phase | Depends on $T_p$ and $U_p$ |

At 120, the simulation application performs a deviatoric MPM solve to obtain updated MAC grid velocities 125. As used herein, the mapping from points in an initial material configuration X to their deformed state x is given by $x=\phi(X)$. Let $$F = \frac{\partial \phi}{\partial X}$$

by the Jacobian of such a mapping. Motion of the material is governed by conservation of mass, conservation of momentum, and the elasto-plastic constitutive relation $$\frac{D\rho}{Dt} = 0, \quad (1)$$

$$\rho \frac{Dv}{Dt} = \nabla \cdot \sigma + \rho g,$$

$$\sigma = \frac{1}{J} \frac{\partial \Psi}{\partial F_E} F_E^T,$$

where $\rho$ is density, t is time, v is velocity, $\sigma$ is the Cauchy stress, g is the gravity, $\Psi$ is the elasto-plastic potential energy density, $F_E$ is the elastic part of the deformation gradient F, and $J=\det(F)$.

For a realistic simulation of melting and freezing, a suitable treatment of plasticity and a well-behaved constitutive model transition between liquid and solid phases of the material are needed. As used herein, the constitutive model includes physical equation(s) which dictate forces that affect the material during the simulation. The jacobian F discussed above may be separated into an elastic part $F_E$ and a plastic part $F_P$ so that $F=F_E F_P$. With this separation, the constitutive model may be derived based on the elasto-plastic fixed co-rotational energy density function $\Psi(F_E)=\Psi_\mu(F_E)+\Psi_\lambda(J_E)$, where $$\Psi_\mu(F_E) = \mu \|F_E - R_E\|_F^2,$$

$$\Psi_\lambda(J_E) = \frac{\lambda}{2}(J_E - 1)^2,$$

and $J_E=\det(F_E)$. This constitutive model $\Psi(F_E)$ is known to be suitable for solids, where $\mu$ and $\lambda$ are typically set to the Young's modulus and Poisson's ratio of the material, which are known values. Furthermore, letting $\mu=0$ makes the energy density dependent only on the local volume change and thus is suitable for liquids, both compressible and incompressible (in the $\lambda \to \infty$ limit). In such a case, it can be shown that the Cauchy stress is a scalar pressure. That is, fluids typically try to preserve volume but will deform under shearing stress (rather than resisting such stress like solids do), so when the material melts, the simulation application uses a constitutive model with $\mu=0$ so that there is no longer any shearing stress.

Although experience has shown that disabling the $\mu$ term in the energy density function (i.e., setting $\mu=0$) when the material is in the fluid phase is enough to produce compelling results, simply enabling or disabling the $\mu$ term is unsuitable for freezing, as this transition results in a sudden large increase in potential energy, which can produce popping artifacts. In order to understand where this energy comes from, consider the dilational $$(J_E)^{\frac{1}{d}} I$$

and deviatoric $$(J_E)^{-\frac{1}{d}} F_E$$

parts of $F_E$, where d is the dimension and I is the identity matrix. The first source of energy is from the $\mu$ term and is the consequence of the deviatoric component $F_E$. The deviatoric part is not used in the $\Psi_\lambda$ and would generally change relatively drastically with the flow. To remedy this, the simulation application may clear the deviatoric component from $F_E$ immediately after this component is updated, which corresponds to the fact that fluids are almost perfectly plastic with respect to deviatoric strain. That is, the simulation application lets $F_E \leftarrow (J_E)^{1/d} I$ at the end of each time step in the fluid phase. Note, this fluid plasticity does not completely eliminate the problem of the sudden increase in potential energy producing artifacts, since the $\mu$ term is nonzero even if $F_E$ contains only a dilational component. To address this, the dilational component may be eliminated explicitly from the $\mu$ component of the constitutive model. This is also done for nearly-incompressible materials and synergistically helps allow for arbitrarily large $\lambda$. That is, an alternative energy density function $\hat{\Psi}(F_E) = \hat{\Psi}_\mu(F_E) + \Psi_\lambda(J_E)$ may be used, where $\hat{\Psi}_\mu(F_E) = \Psi_\mu(J_E^{-1/d} F_E)$. The chain rules then gives the deviatoric stress as $$\sigma_\mu = \frac{1}{J} \frac{\partial \hat{\Psi}_\mu}{\partial F_E}(F_E) F_E^T.$$

In general, material parameters, e.g., $\mu$ and $\lambda$, can be defined as functions of the current temperature and the current phase. But experience has shown that keeping such parameters constant with temperature and simply setting the $\mu$ term to zero for the fluid state is sufficient to produce visually compelling results.

At 130, the simulation application further performs a cell-centered pressure solve 130 to obtain final MAC grid velocities, which are interpolated and used to update a deformation gradient. To handle nearly incompressible materials, arbitrarily large values of $\lambda$ may be allowed in the constitutive model. Doing so requires careful treatment of the $\Psi_\lambda$ term in the energy. Observe that $\Psi_\lambda$ leads to a dilational Cauchy stress as $$\sigma_\lambda = \frac{1}{J} \left( \frac{\partial \Psi_\lambda}{\partial J_E} \frac{\partial J_E}{\partial F_E} \right) \quad (2)$$

$$F_E^T = \frac{1}{J} \frac{\partial \Psi_\lambda}{\partial J_E}$$

$$J_E F_E^{-T} F_E^T = -pI,$$

where $$p = -\frac{1}{J_P} \frac{\partial \Psi_\lambda}{\partial J_E} = -\frac{1}{J_P} \lambda (J_E - 1)$$

is introduced for convenience. Although $\lambda$ is very large for nearly incompressible materials, deviation from incompressibility will be small so $\lambda(J_E - 1)$ will be finite. Rather than computing p directly, p may instead be treated as a separate variable, which facilitates the transition to a fully incompressible material. This can be achieved via the following evolution:

$$\frac{Dp}{Dt} = -\frac{1}{J_P} \frac{\partial^2 \Psi_\lambda}{\partial J_E \partial J_E} \frac{DJ_E}{Dt}. \quad (3)$$

Further, since $$J = J_E J_P \text{ and } \frac{DJ}{Dt} = J \nabla \cdot v, \frac{DJ_E}{Dt} = J_E \nabla \cdot v.$$

Accordingly, $$\frac{Dp}{Dt} = -\frac{1}{J_P} \frac{\partial^2 \Psi_\lambda}{\partial J_E \partial J_E} J_E \nabla \cdot v = -\frac{\lambda J_E}{J_P} \nabla \cdot v. \quad (4)$$

With this definition of p, the force balance equation takes the fluid-like form $$\rho \frac{Dv}{Dt} = \nabla \cdot \sigma + \rho g = \nabla \cdot \sigma_\mu - \nabla p + \rho g, \quad (5)$$

where $\sigma_\mu$ the component of stress from $\Psi_\mu$. The pressure equations may then be discretized in time as $$\frac{p^{n+1} - p^n}{\Delta t} = \frac{\lambda^n J_E^n}{J_P^n} \nabla \cdot v^{n+1}. \quad (6)$$

For the velocity equation, the following discretization may be used:

$$\frac{v^{n+1} - v^n}{\Delta t} = -\frac{1}{\rho^n} \nabla \cdot \sigma_\mu - \frac{1}{\rho^n} \nabla p^{n+1} + g. \quad (7)$$

Note that in equations (6) and (7), the material derivative can be replaced with a simple finite difference in time because advection is performed in a Lagrangian manner using MPM.

The pressure application may also be split from other forces by introducing an intermediate $v^*$ $$\frac{v^* - v^n}{\Delta t} = \frac{1}{\rho^n} \nabla \cdot \sigma_\mu + g, \frac{v^{n+1} - v^*}{\Delta t} = -\frac{1}{\rho^n} \nabla p^{n+1}. \quad (8)$$

Taking the divergence of the second equation and eliminating $\nabla \cdot v^{n+1}$ using the pressure equation yields $$\frac{J_P^n}{\lambda^n J_E^n} \frac{p^{n+1}}{\Delta t} - \Delta t \nabla \cdot \left( \frac{1}{\rho^n} \nabla p^{n+1} \right) = \frac{J_P^n}{\lambda^n J_E^n} \frac{p^n}{\Delta t} - \nabla \cdot v^*. \quad (9)$$

Here, $$p^n = -\frac{1}{J_P^n} \lambda^n (J_E^n - 1)$$

may be used for the right-hand side of equation (9).

Note that the discrete system for the pressure will be symmetric positive definite and similar to a discrete heat equation for moderate λ. As λ is increased to the incompressible limit, the pressure equation is then the Poisson equation seen in Chorin-style projections. While the introduction of an auxiliary pressure unknown is common in incompressible elasticity, it would generally be coupled with velocity unknowns. By contrast, the implicit treatment discussed above based on the evolution equation (2) decouples the pressure from the nonlinear equations for velocity unknowns and thereby improves efficiency.

In parallel to the mechanical evolution of 110-140, the simulation application also computes a thermodynamic evolution using the MAC grid as a scratchpad. Although shown as being in parallel, the mechanical evolution may be computed after the mechanical evolution or vice versa, etc., for each time step, as discussed in greater detail below. As shown, the simulation application rasterizes the initial MPM particles to the grid at 145 to obtain initial cell-centered temperature and heat 150. Then, at 155, the simulation application performs a cell-centered Poisson heat-solve to obtain final cell-centered temperature and heat 160, which are interpolated and used to update the phase of the material at 165. Heat flow is given by $$\rho \frac{Du}{Dt} = -\nabla \cdot q, \, q = -\kappa \nabla T, \, c = \frac{du}{dT}, \quad (10)$$

where u is stored heat energy per unit mass, T is temperature, q is heat flux, κ is heat conductivity in accordance with Fourier's Law, and c is heat capacity per unit mass. Eliminating u and q leads to the heat equation $$\rho c \frac{DT}{Dt} = \nabla \cdot (\kappa \nabla T). \quad (11)$$

This is a simplified model in which it is assumed that no transfer between mechanical energy and heat energy of the system occurs (and hence u is a function of T only). Additionally, instead of representing volumetric heat source terms, boundary heat conditions are used herein. Note, the complete physical model according to a configuration is a thermo-mechanical model that brings together the mechanical and heat systems discussed above. This may be accomplished by varying, with temperature and phase, the elasto-plastic potential energy density Ψ in equation (1). In one configuration, different expressions for Ψ are used depending on whether the material is in a solid or liquid state, as discussed in greater detail below.

The heat equation (11) may be used to discretize the temperature evolution in time as $$T^{n+1} - T^n = \frac{\Delta t}{\rho^n c^n} \nabla \cdot (\kappa^n \nabla T^{n+1}). \quad (12)$$

That is, the temperature at time n+1 may be determined from the temperature at time n using equation (12). Phase transition is a separate process in the sense that it requires extra heat, called latent heat, which cannot be observed as a temperature change. Specifically, latent heat of fusion L is required to transfer a material from solid into liquid state isothermally at the freezing point of the material. In one configuration, latent heat may be modeled using a buffer which stores an amount of heat from 0 to L, with the material phase being changed when the buffer becomes full or empty, as discussed in greater detail below. At 165, the simulation application interpolates the temperature and updates the phase of particles, which in conjunction with the interpolated velocities and updated deformation gradients at 140 produces the final MPM particles 170 for the given time step.

Figure 2:
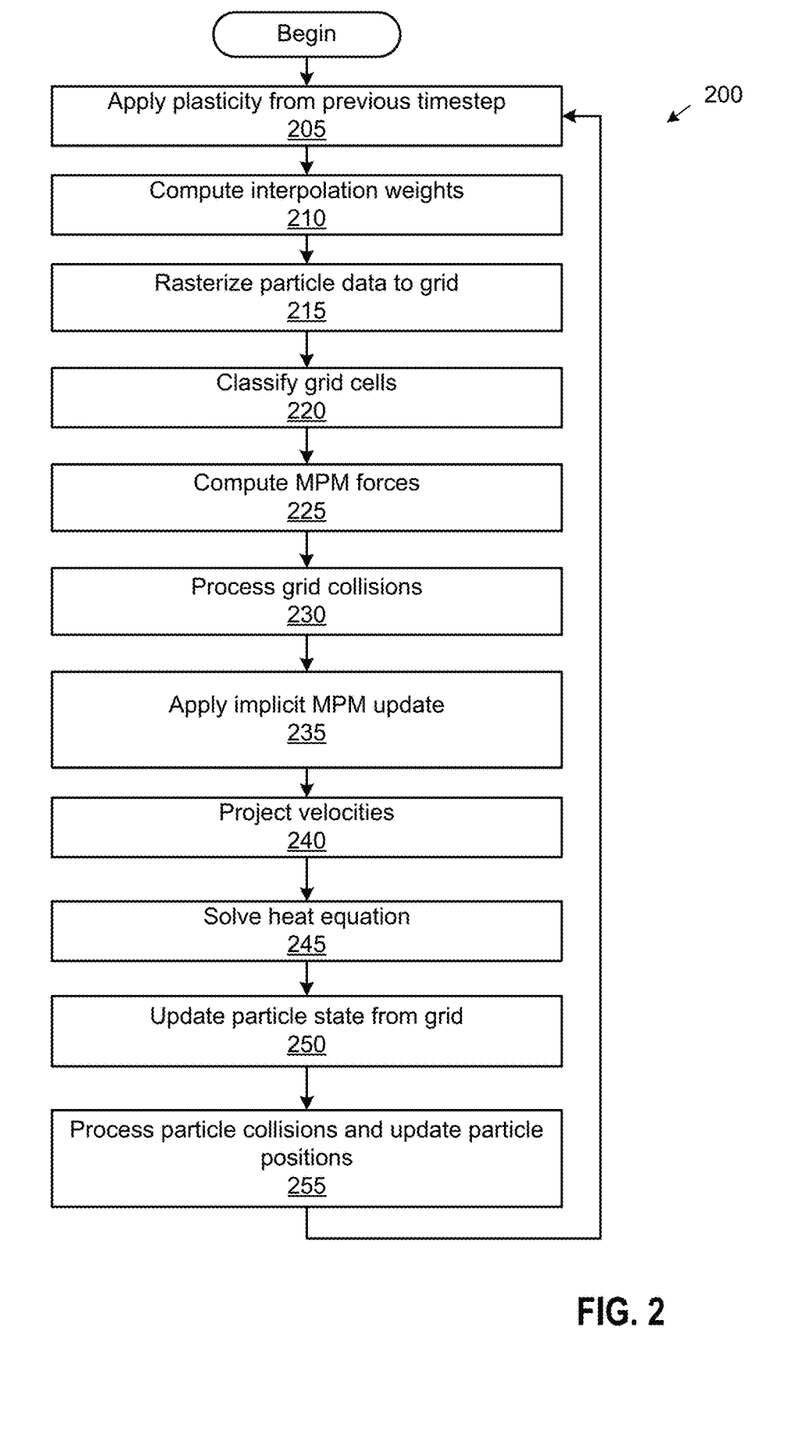
FIG. 2 illustrates a more detailed flowchart of a method for simulating varied materials and phase transitions, according to an aspect of this disclosure.

FIG. 2 illustrates a detailed flowchart of a method 200 for simulating varied materials, according to an aspect of this disclosure. As shown, the method 200 begins at step 205, where the simulation application applies a plasticity calculated at a previous timestep. For simplicity, it is common to apply a heuristic plastic-yield criterion for compressible elastic materials, as there is considerable leeway in visual applications. However, in the case of nearly incompressible materials, the plastic flow should also be nearly incompressible. The simulation application may use a simple procedure to guarantee $J_P \equiv \det(F_P)=1$ for nearly incompressible materials. Specifically, the simulation application may begin by adjusting $F_E$ and $F_P$ so that the singular values of $F_E$ are restricted to the interval $[1-\theta_c, 1+\theta_s]$ as in patent application Ser. No. 14/257,044. Then, the simulation application may apply the correction $F_E \leftarrow (J_P)^{-1/d} F_E$ and $F_P \leftarrow (J_P)^{-1/d} F_P$, which ensures that $F_P$ is purely deviatoric, or equivalently, that $J_P=1$.

At step 210, the simulation application computes interpolation weights. In order to transfer data from particles to MAC and MAC cell centers, multiple sets of interpolation weights are needed. Considering the MAC faces for each dimension as a regular cell-centered Cartesian grid, the simulation application may compute interpolating weights for d+1 grids based at $(x_{0a}, y_{0a}, z_{0a})$, where $a \in \{x,y,z\}$ indicate velocity components, and a=* represents the pressure grid. The cell-centered origins for the respective grids are $$(x_{0x}, y_{0x}, z_{0x}) = \left(-\frac{h}{2}, 0, 0\right), (x_{0y}, y_{0y}, z_{0y}) = \left(0, -\frac{h}{2}, 0\right),$$
$$(x_{0z}, y_{0z}, z_{0z}) = \left(0, 0, -\frac{h}{2}\right), \text{ and } (x_{0*}, y_{0*}, z_{0*}) = (0, 0, 0),$$

where h is the grid spacing. Thus, the grids are offset with respect to one another, but the weights for each are computed in the same way. Given a grid of spacing h with cell indices c=(i,j,k) with centers located at $x_{ca}=(x_i,y_j,z_k)=(x_{0a}+ih, y_{0a}+jh, z_{0a}+kh)$, interpolation can be defined for arbitrary $x_p=(x_p, y_p, z_p)$. A multidimensional separable kernel can be defined from the one-dimensional cubic B-spline $$N(x) = \begin{cases} \frac{1}{2}|x|^3 - x^2 + \frac{2}{3}, & 0 \le |x| < 1 \\ -\frac{1}{6}|x|^3 + x^2 - 2|x| + \frac{4}{3}, & 1 \le |x| < 2 \\ 0, & \text{otherwise} \end{cases} \quad (13)$$

as $$N_{ca}^h(x_p) = N\left(\frac{1}{h}(x_p - x_{ia})\right) N\left(\frac{1}{h}(y_p - y_{ja})\right) N\left(\frac{1}{h}(z_p - z_{ka})\right).$$

In the more compact notation used herein, i is an index into MAC grid faces, and c is an index for cell-centered quantities. For example, $v_i$ stands for the velocity field component at face i, and $p_c$ is the pressure value at the center of c. With this notation, the interpolation of particle $x_p$ is $w_{ip} = N_{c(i)a(i)}{}^h(x_p)$ with respect to face i and $w_{cp} = N_{c*}{}^h(x_p)$ with respect to cell c. Here, a(i) and c(i) are the dimension component and cell index associated with face i, respectively. Alternatively, the face index can be uniquely identified by a cell and an axis as i=i(c,a), for $a \in \{x,y,z\}$. Similarly, the change in the interpolation of particle $x_p$ with respect to face i and with respect to cell c may be defined as $\nabla w_{ip} = \nabla N_{c(i)a(i)}{}^h(x_p)$ and $\nabla w_{cp} = \nabla N_{c*}{}^h(x_p)$. The various components and their associated values are summarized in Table 2.

TABLE 2

| Grid | a | Base | Weight |
|---|---|---|---|
| cell | * | (0, 0, 0) | $w_{cp} = N_{c*}{}^h(x_p)$ |
| x-offset | x | $\left(-\frac{h}{2}, 0, 0\right)$ | $w_{i(c,x)p} = N_{cx}{}^h(x_p)$ |
| y-offset | y | $\left(0, -\frac{h}{2}, 0\right)$ | $w_{i(c,y)p} = N_{cy}{}^h(x_p)$ |
| z-offset | z | $\left(0, 0, -\frac{h}{2}\right)$ | $w_{i(c,z)p} = N_{cz}{}^h(x_p)$ |

At step 215, the simulation application rasterizes particle data to a grid. The simulation application rasterizes data to the grid using the interpolation weights discussed above with respect to step 214. In one configuration, mass is first rasterized to the grid faces as $m_i^n = \Sigma_p w_{ip}^n m_p$. These face densities allow the normalization of the interpolation of velocity and thermal conductivity as $$v_i^n = \frac{1}{m_i^n} \sum_p w_{ip}^n m_p v_i^n \text{ and } \kappa_i^n = \frac{1}{m_i^n} \sum_p w_{ip}^n m_p \kappa_p.$$

This process may be repeated at cell centers, first with cell masses $m_c^n = \Sigma_p w_{cp}^p m_p$, then followed by $$J_c^n = \frac{1}{m_c^n} \sum_p w_{cp}^n m_p J_p^n, \quad c_c^n = \frac{1}{m_c^n} \sum_p w_{cp}^n m_p c_p,$$

$$J_{Ec}^n = \frac{1}{m_c^n} \sum_p w_{cp}^n m_p J_{Ep}^n$$

$$\left(\text{then } J_{Pc}^n = \frac{J_c^n}{J_{Ec}^n}\right), \text{ and } T_c^n = \frac{1}{m_c^n} \sum_p w_{cp}^n m_p T_p^n.$$

Note that $$\frac{1}{\lambda_c^n} = \frac{1}{m_c^n} \sum_p w_{cp}^n m_p \lambda_p^{-1}$$

is rasterized rather than $$\lambda_c^n = \frac{1}{m_c^n} \sum_p w_{cp}^n m_p \lambda_p.$$

This more accurately resolves the pressure $$\frac{-\lambda_c^n}{J_{Pc}^n}(J_{Ec}^n - 1)$$

under large variation of λ. Experience has shown that failure rasterize as $$\lambda_c^n = \frac{1}{m_c^n} \Sigma_p w_{cp}^n m_p \lambda_p$$

causes some instability.

At step 220, the simulation application classifies cells. In one configuration, collision objects may be represented as level sets, and the simulation application may assign each collision object a temperature. In such a case, the simulation application may begin the collision process by checking all faces for collisions. A MAC face is colliding if the level set computed by any collision object is negative at the face center. If the face is colliding, the simulation application flags the face as such. For convenience and consistency, each MAC cell may simply be classified as empty, colliding, or interior. A cell may be marked as colliding if all of its surrounding faces are colliding. A cell may be marked as interior if the cell and all of its surrounding faces have mass. All remaining cells may be marked as empty. Further, for colliding cells, the simulation application may assign either the temperature of the object the cell collides with or a user-defined spatially-varying value depending on the setup. If the free surface is being enforced as a Dirichlet temperature condition, the ambient air temperature may be recorded for empty cells. Other cells may not require temperatures to be recorded at this stage.

At step 225, the simulation application computes material point method forces. In the deviator/dilational splitting of the material response, discussed above, the deviatoric forces are discretized with implicit MPM, and the dilation part is discretized with the generalized Chorin-style projection. Using the common notation from a projection method, the implicit MPM step can be considered as updating the rasterized grid based velocities $v_i^n$ to $v_i^*$. To obtain grid velocities, the simulation application may then apply the pressure correction to $v_i^*$ to obtain $v_i^{n+1}$. The first step for computing $v_i^*$ itself is to compute the MPM force.

Following the approach of patent application Ser. No. 14/257,044, the deviatoric forces may be discretized via a potential energy. This naturally facilitates an implicit treatment with symmetric linearization. Let the location of grid face i be denoted as $x_i$. If the Eulerian MAC grid is interpreted as though it were Lagrangian, then after time Δt, the face would have moved to $\hat{x}_i = x_i + \Delta t v_i^* e_{a(i)}$, where $e_{a(i)}$ is the basis vector in the direction corresponding to the MAC velocity component $v_i^*$. Let the vector of all $\hat{x}_i$ be denoted by $\hat{x}$. Such a vector can be considered as depending on the vector of all face velocities $v_i^*$ which can be denoted as $v^*$. In other words, $\hat{x} = \hat{x}(v^*)$. Note that this interpretation is for convenience in computing forces and force derivatives, as the grid does not actually have to move. Since there is only really one degree of freedom in $\hat{x}_i$, it can be denoted as $\hat{x}_i = (\hat{x}_i)_{a(i)}$ and $\hat{x}_i = \hat{x}_i(v_i^*) = (\hat{x}_i)_{a(i)} + \Delta t v_i^*$.

The deviatoric potential energy is then $$\Phi_\mu(\hat{x}) = \Sigma_p V_p^0 \hat{\Psi}_\mu(\hat{F}_{Ep}(\hat{x})) \quad (14)$$

where $V_p^0$ is the initial volume occupied by particle p, and $\hat{F}_{E_p}$ is the elastic part of the deformation gradient of particle p. $\hat{F}_{Ep}$ depends on $\hat{x}$ as $$\hat{F}_{Ep}(\hat{x}) = (I + \Sigma_i(\hat{x}_i - x_i)(\nabla w_{ip}^n)^T) F_{Ep}^n. \quad (15)$$

The force component $f_i$ at face i is given by $$f_i = -\frac{\partial \Phi}{\partial \hat{x}_i} = -\frac{\partial \Phi}{\partial \hat{F}_{Ep}} \frac{\partial \hat{F}_{Ep}}{\partial \hat{x}_i} \frac{\partial x_i}{\partial x_i},$$

or $$f_i(\hat{x}) = -\Sigma_p V_p^0 e_{a(i)}^T \frac{\partial \Psi}{\partial F_E}(\hat{F}_{Ep}(\hat{x}))(F_{Ep}^n)^T \nabla w_{ip}^n. \quad (16)$$

With these forces, the simulation application computes the right hand side for the MPM treatment $$b_i = v_i^n + \frac{\Delta t}{m_i^n} f_i + \Delta t g_i \Sigma_p w_{ip}^n, \quad (17)$$

where $g_i$ is the gravity component at face i, and $$f_i^n = -\frac{\partial \Phi_\mu}{\partial \hat{x}_i}(\hat{x}(0)),$$

again using the convention that $\hat{x} = \hat{x}(v^*)$.

At step 235, the simulation application processes grid collisions. Each face marked as colliding during step 220 must have its velocity corrected for the collisions. In one configuration, the simulation application may perform sticking collisions for all of the collisions, so that the simulation application simply assigns the velocity component from the collision body to the corresponding face on the MAC grid.

At step 236, the simulation application applies a semi-implicit material point method update. In one configuration, the simulation application may use one step of Newton's method to solve the implicit system for deviatoric and inertial force balance. This yields the following (mass) symmetric system for $v^*$ $$\Sigma_j \left( \delta_{ij} + \frac{\Delta t^2}{2m_i^n} \frac{\partial^2 \Phi_\mu}{\partial \hat{x}_i \partial \hat{x}_j}(\hat{x}(0)) \right) v_j^* = b_i. \quad (18)$$

The system is symmetric but potentially indefinite, so the iterative conjugate residual method may be used, as this Krylov method only requires the action of the matrix on an arbitrary increment $\delta u$ (comprised of scalar MAC face increments $\delta u_i$). The non-trivial term is from the Hessian and can be expressed as $$\delta f_i = \Sigma_j \frac{\partial^2 \Phi_\mu}{\partial \hat{x}_i \partial \hat{x}_j}(\hat{x}(0))) \delta u_j = \Sigma_p V_p^0 e_{a(i)}^T A_p (F_{Ep}^n)^T \nabla w_{ip}^n, \quad (19)$$

where $$A_p = \frac{\partial^2 \Psi_\mu}{\partial F_E \partial F_E}(F_E(\hat{x})) : (\Sigma_j \delta u_j e_{a(i)}(\nabla w_{jp}^n)^T F_{Ep}^n). \quad (20)$$

At step 240, the simulation application projects velocities. In one configuration, equation (9), discussed above, may be discretized to obtain the pressure, and the simulation application may use such a pressure to correct the intermediate velocities $v^*$. This is a discrete parabolic equation that reduces to a Poisson equation in the incompressible limit of $\lambda \to \infty$. In either case, the discretization reduces to a symmetric positive definite system of equations. In one configuration, the discretization in space may be accomplished using the central-difference stencils naturally defined over the MAC grid. The right hand side of the system would then have entries $s_c$ stored at MAC cell centers. The simulation application may compute such $s_c$ as $$s_c = -\frac{J_{Ec}^n - 1}{\Delta t J_{Ec}^n} - \Sigma_i^n G_{ic} v_i^*,$$

where $G_{ic}$ are the coefficients of the central-differenced gradient stencil. The corresponding matrix takes the increments $\delta p_c$ and produces the results $\delta r_c$, where $$\delta r_c = \frac{\delta p_c J_{Pc}^n}{J_{Ec}^n \lambda_c^n \Delta t} + \Delta t \Sigma_i \Sigma_{c'} \frac{1}{\rho_i^n} G_{ic} G_{ic'} \delta p_{c'} \text{ and } \rho_i^n = \frac{m_i^n}{V_i^n}$$

is the mass density at face i, $m_i^n$ is the mass at the face, and $V_i^n$ is a control volume around the face whose formulas are as described below. After solving for the pressure, the simulation application applies the pressure correction to the velocities using $$v_i^{n+1} = v_i^* - \Delta t \Sigma_c \frac{1}{\rho_i^n} G_{ic} p_c.$$

The discretization of $G_{ic}$ corresponds to a simple voxelized, central-differenced gradient operator. The simulation application may enforce homogeneous Dirichlet pressure boundary conditions at cells that have been marked as empty and homogenous Neumann boundary conditions at faces adjacent to cells that have been marked as colliding.

Degrees of freedom near collision objects do not have as many neighboring particles as interior degrees of freedom, since part of their influence is covered by a collision object. This effect can cause such faces to appear lighter, which would in turn cause the faces to rise under gravity without careful definition of $\rho_i^n$. In one configuration, the simulation application may prevent such phenomena by computing control volumes that accurately represent the portion of the domain associated with a face. In particular, the simulation application may compute $V_i^n = \Sigma_c \int_{\Omega_c} \chi_c N_{c(i)a(i)}^h(x) dx$, where $\Omega_c$ is the interior of MAC cell c and $\chi_c = 1$ if cell c is marked as interior and $\chi_c = 0$ otherwise. This is an approximation to $\int_{\Omega^n} N_i^h dx$ where $\Omega^n$ is the domain encompassed by the material. This control volume is important for accurately approximating the density near collision objects. Note that the integral described in the formula for $V_i^n$ has only a finite number of cases, which the product structure of $N_{c(i)a(i)}^h(x)$ makes relatively easy to tabulate.

At step 245, the simulation application solves the heat equation. In one configuration, the simulation application performs a stabilized Poisson solve to update the temperature in accordance with equation (12). In such a case, the simulation application may begin by setting the right hand side to $T_c^n$, which is a cell centered rasterized temperature. The corresponding matrix takes the increments $\delta T_c$ and produces the result $$\delta T_c + \Delta t \Sigma_i^n \Sigma_{c'} \frac{\Delta x^d}{m_c^n c_c^n} \kappa_i^n G_{ic} G_{ic'} \delta T_{c'}.$$

The discretization of $G_{ic}$ corresponds to a simple voxelized, central-differenced gradient operator. The simulation application may enforce Dirichlet temperature boundary conditions at cells that are in contact with fixed temperature bodies (like a heated pan or air) and homogenous Neumann boundary conditions at faces adjacent to cells that can be considered empty or corresponding to insulated objects.

At step 250, the simulation application updates particle states from the grid. Some outermost faces involved in the Chorin-style projection of step 240 do not receive a correction and, as a result, such faces may have outdated velocity values. To prevent errors from uncorrected velocities when transferring information back to the particles, a tighter quadratic stencil, given by the following spline, may be used:

$$N(x) = \begin{cases} -x^2 + \frac{3}{4}, & 0 \leq |x| < \frac{1}{2} \\ \frac{1}{2}x^2 - \frac{3}{2}x + 9/8, & 1 \leq |x| < 3/2 \\ 0, & \text{otherwise} \end{cases} \quad (21)$$

In one configuration, the simulation application interpolates velocities back to particles using FLIP, where the PIC component is computed as $v_p^{PIC} = \Sigma_i v_i^{n+1} w_{ip}^n e_{a(i)}$ and the FLIP component as $v_p^{FLIP} = v_p^n + \Sigma_i (v_i^{n+1} - v_i^n) w_{ip}^n e_{a(i)}$. Given these computations, the velocities are $v_p^{n+1} = \alpha v_p^{FLIP} + (1-\alpha) v_p^{PIC}$, where $\alpha$ is the flip fraction. In a particular configuration, an $\alpha$ value of 0.95 may be used.

After interpolating velocities back to the particles, the simulation application updates the elastic part of the deformation gradient of particle $F_{Ep}$. A velocity gradient must be determined for this update, and in one configuration the simulation application may compute the velocity gradient with $v_p^{n+1} = \alpha v_p^{FLIP} + (1-\alpha) v_p^{PIC}$. A simple way to update $F_{Ep}$ would then be with the update rule $F_{Ep}^{n+1} = (I + \Delta t \nabla v_p^{n+1}) F_{Ep}^n$. However, experience has shown that this update occasionally leads to $J_{Ep}^{n+1} \leq 0$ if the time step is too large. A compromise $F_{Ep}^{n+1} = R(\Delta t \nabla v_p^{n+1}) F_{Ep}^n$ between this simple rule and the ideal but expensive exponential computation $F_{Ep}^{n+1} = e^{\Delta t \nabla v_p^{n+1}} F_{Ep}^n$ may be used instead, where $$R(M) = I + M \text{ if } \det(I + M) > 0 \text{ and } R(M) = R\left(\frac{1}{2}M\right)^2$$

otherwise. Note that this is effectively a truncated version of the computation of the exponential function, and the simulation application may invest just enough time to keep the determinant positive. In practice, the function $F_{Ep}^{n+1} = R(\Delta t \nabla v_p^{n+1}) F_{Ep}^n$ recurses very rarely, and the update is more robust but nearly as efficient as the simple rule. If p is a fluid particle, the simulation application may finish the update of $F_{Ep}^{n+1}$ by removing its deviatoric component, as discussed above, using $F_{Ep}^{n+1} \leftarrow (J_p^{n+1})^{1/d} I$.

Similarly, temperature may be transferred from grid cell centers to particles as $T_p^{n+1} = \beta T_p^{FLIP} + (1-\beta) T_p^{PIC}$, where $T_p^{FLIP} = T_p^n + \Sigma_c (T_c^{n+1} - T_c^n) w_{cp}$, $T_p^{PIC} = \Sigma_c T_c^n w_{cp}$, and $\beta$ is the FLIP ratio (e.g., 0.95 may be used). Note, however, that the presence of non-zero latent heat would not allow the temperature to go through the freezing point in this way, since a portion of the heat the particle gets (or loses) should be spent on the phase change. To account for this latent heat effect, the simulation application may maintain an energy buffer for each particle of size $L_p$, with the particle storing the amount of heat $U_p$ contained in the buffer, which can vary from 0 to $L_p$. Whenever the freezing point is reached, the simulation application multiplies any additional temperature change by $c_p m_p$ and adds this value to the buffer. Once the buffer is completely full (or empty), i.e., particle heat $U_p$ equals $L_p$ (or 0), the simulation application then switches the particle phase to fluid (or solid) and continues with the regular temperature update. In one configuration, the phase change happens only when the buffer is completely full or empty. Otherwise, the material retains its phase from the previous timestep, and this sort of hysteresis, as opposed to using a hard threshold on $U_p$, allows more stable phase transitions.

At step 255, the simulation application processes particle collisions and updates particle positions. That is, the simulation application completes the time integration by enforcing collisions on the particles. As discussed, sticking collisions may be used with the grid, and, in such a case, the simulation application may also model sticking collisions with the particles as well. In one configuration, the simulation application may register a particle as colliding if a collision body registers a negative level set value at the location of the particle. If this occurs, the particle's velocity is set to the velocity of the collision body at that location. The simulation application then updates the particle positions as $x_p^{n+1} = x_p^n + \Delta t v_p^{n+1}$.

Figure 3:
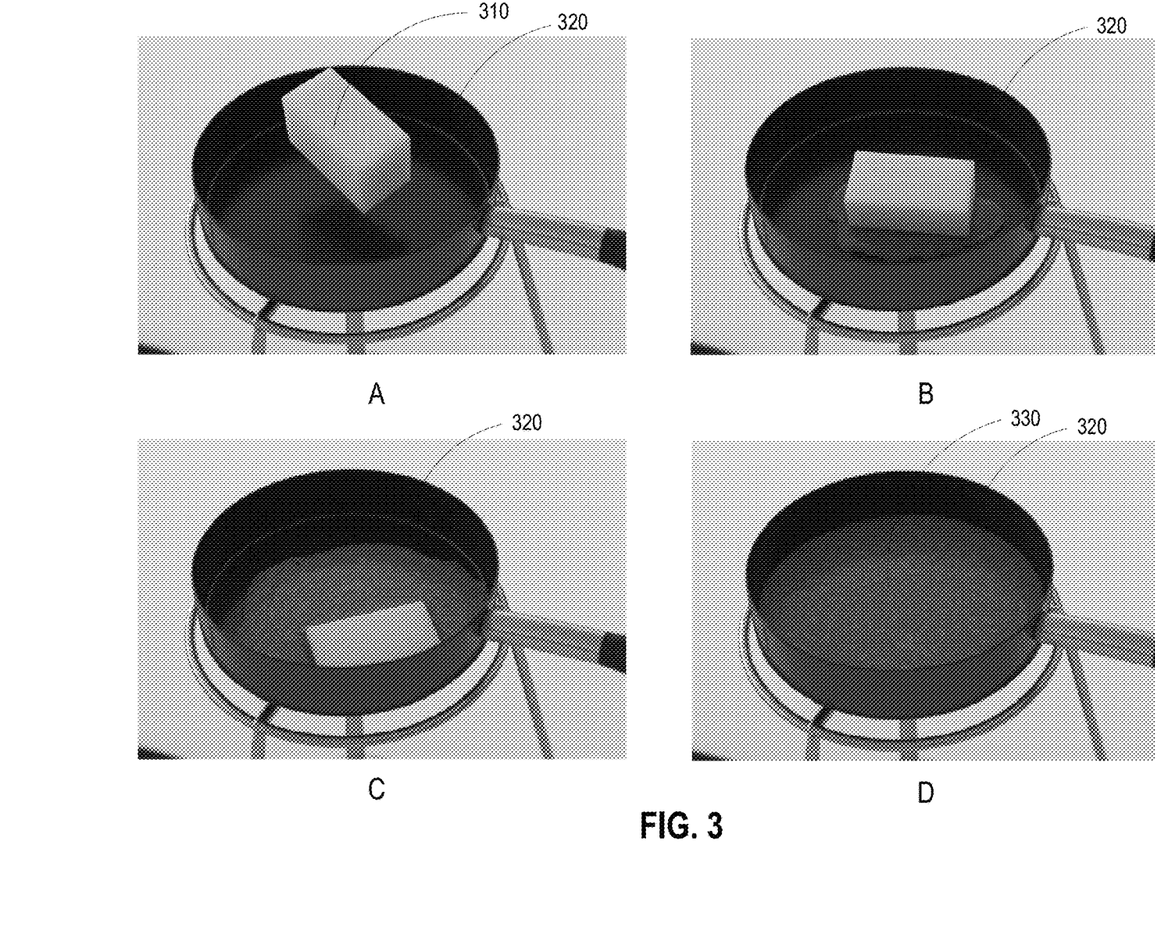
FIG. 3 illustrates an example simulation and rendering of a material undergoing phase change.

FIG. 3 illustrates an example simulation and rendering of a material undergoing phase change, according to an aspect of this disclosure. As shown, the simulation is of butter melting over a hot frying pan 420. Illustratively, a solid chunk of the butter 410 is exposed to the frying pan 420, which acts as an external heat source to melt the chunk of butter 410 into melted butter 430. $4.2 \times 10^6$ particles, a grid resolution of $128 \times 128 \times 128$, and a timestep size of $\Delta t = 3 \times 10^{-4}$ seconds were used to simulate the melting butter. The treatment of the physics of phase transitions discussed herein allows the simulation application to maintain sharp, yet stable, interfaces between solid and fluid phases. Further, the augment MPM method discussed above captures many intricate features of the melting process, such as wave-like spread and micro ripples of the fluid phase, as well as the sliding behavior of the solid chunk of butter on top of the fluid. By varying the butter material's parameters such as heat conductivity, heat capacity, and latent heat, the heat flow can be controlled, which is an indirect way to affect the dynamics of melting and freezing.

The rendering of the melting butter simulation may be achieved with meshing solutions, or any other feasible technique. Meshing solutions typically involve rasterizing particles to a grid using some basis function followed by grid smoothing, contouring, and final surface smoothing.

Figure 4:
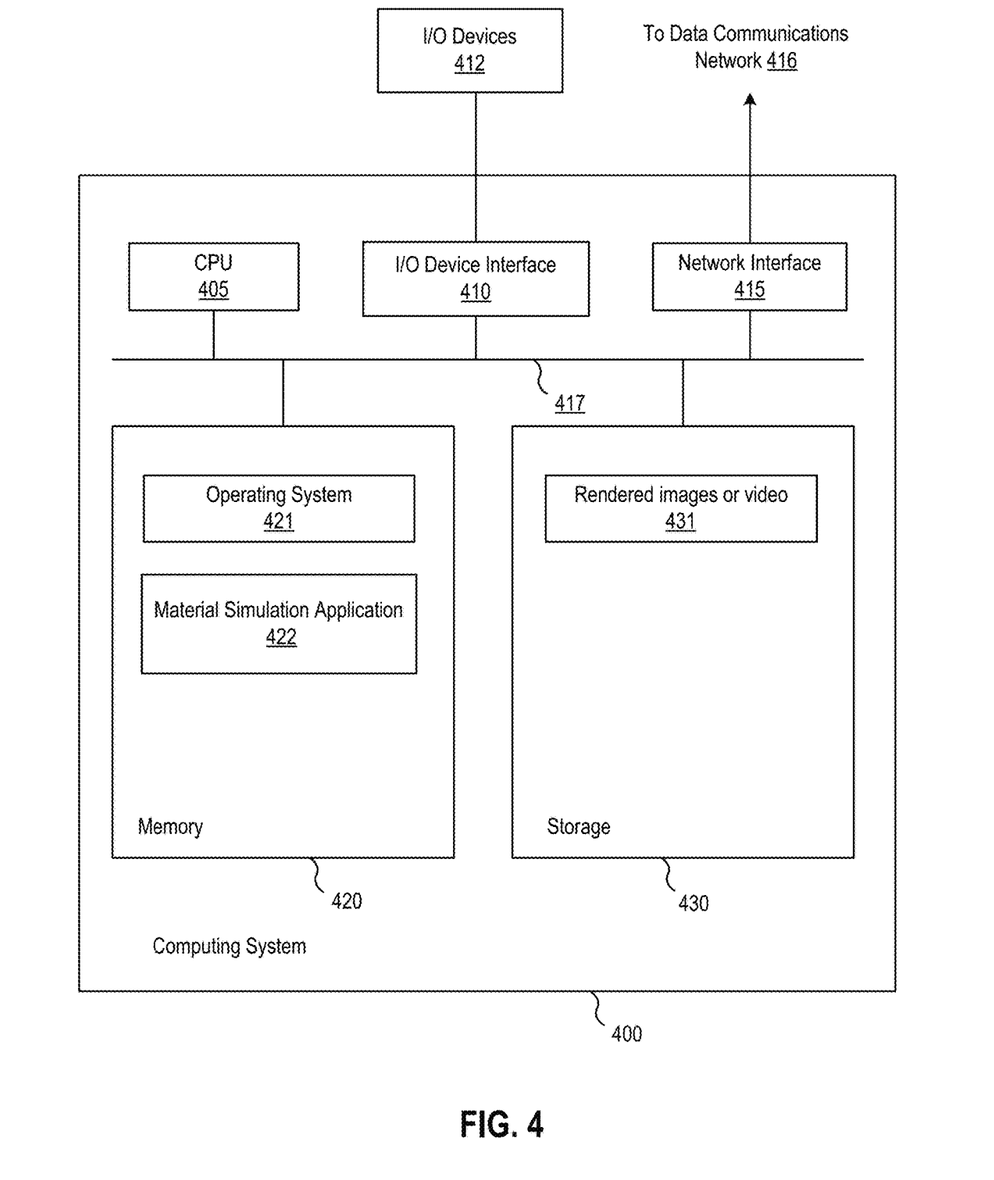
FIG. 4 illustrates a system in which an aspect of this disclosure may be implemented.

FIG. 4 illustrates a system 400 in which an aspect of this disclosure may be implemented. As shown, the system 400 includes, without limitation, a central processing unit (CPU) 405, a network interface 415 connecting the system to a network 416, an interconnect 417, a memory 420, and storage 430. The system 400 may also include an I/O device interface 410 connecting I/O devices 412 (e.g., keyboard, display and mouse devices) to the system 400.

The CPU 405 retrieves and executes programming instructions stored in the memory 420. Similarly, the CPU 405 stores and retrieves application data residing in the memory 420. The interconnect 417 facilitates transmission, such as of programming instructions and application data, between the CPU 405, I/O device interface 410, storage 430, network interface 415, and memory 420. CPU 405 is included to be representative of a single CPU, multiple CPUs, a single CPU having multiple processing cores, and the like. And the memory 420 is generally included to be representative of a random access memory. The storage 430 may be a disk drive storage device. Although shown as a single unit, the storage 430 may be a combination of fixed and/or removable storage devices, such as magnetic disk drives, flash drives, removable memory cards or optical storage, network attached storage (NAS), or a storage area-network (SAN). Further, system 400 is included to be representative of a physical computing system as well as virtual machine instances hosted on a set of underlying physical computing systems. Further still, although shown as a single computing system, one of ordinary skill in the art will recognized that the components of the system 400 shown in FIG. 4 may be distributed across multiple computing systems connected by a data communications network.

As shown, the memory 420 includes an operating system 421 and a simulation application 422. Illustratively, the operating system 421 may include Linux®. The simulation application 422 is configured to simulate material phenomena and render the simulated phenomena to one or more video frames. In one configuration, the simulation application 422 may use an augmented MPM procedure to simulate the material, and render the simulated material to images or video frames, as discussed above with respect to FIGS. 1-3.

Advantageously, techniques disclosed herein permit simulation and rendering of materials across different states. The inability of traditional MPM to handle arbitrarily incompressible materials such as liquids is overcome by augmenting MPM with a Chorin-style projection technique that enables simulation of arbitrarily incompressible materials. Further, phase transitions and changes in material properties are handled by updating the phase and material properties according to a temperature obtained by solving the heat equation on the MPM grid. Techniques disclosed herein can also handle mixtures of materials with different properties, ranging from compressible to (almost) incompressible and varying stiffness and plasticity parameters.

The preceding description references aspects of the disclosure. However, it should be understood that the disclosure is not limited to specific described aspects. Instead, any combination of the preceding features and elements, whether related to different aspects or not, is contemplated to implement and practice the disclosure. Furthermore, although aspects of the disclosure may achieve advantages over other possible solutions and/or over the prior art, whether or not a particular advantage is achieved by a given aspect is not limiting of the disclosure. Thus, the preceding aspects, features, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Aspects of the present disclosure may be embodied as a system, method or computer program product. Accordingly, aspects of the present disclosure may take the form of an entirely hardware aspect, an entirely software aspect (including firmware, resident software, micro-code, etc.) or an aspect combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus or device.

The flowchart and block diagrams in the Figures illustrate the architecture, functionality and operation of possible implementations of systems, methods and computer program products according to various aspects of the present disclosure. In this regard, each block in the flowchart or block diagrams may represent a module, segment or portion of code, which comprises one or more executable instructions for implementing the specified logical function(s). In some alternative implementations the functions noted in the block may occur out of the order noted in the figures. For example, two blocks shown in succession may, in fact, be executed substantially concurrently, or the blocks may sometimes be executed in the reverse order, depending upon the functionality involved. Each block of the block diagrams and/or flowchart illustrations, and combinations of blocks in the block diagrams and/or flowchart illustrations can be implemented by special-purpose hardware-based systems that perform the specified functions or acts, or combinations of special purpose hardware and computer instructions.

While the foregoing is directed to aspects of the present disclosure, other and further aspects of the disclosure may be devised without departing from the basic scope thereof, and the scope thereof is determined by the claims that follow.

What is claimed is:

1. A computer-implemented method for simulating and rendering a material while avoiding material point method locking, comprising:

for each of a plurality of time steps of a simulation of the material undergoing a phase transition between two states of the material:
   transferring states of particles representing the material to a grid,
   determining intermediate grid velocities using a material point method computation, wherein the material point method computation discretizes deviatoric forces, including shear forces, that affect the material using a deviatoric component of a constitutive model, the constitutive model dictating forces that affect the material and splitting into the deviatoric component and a dilational component, applying a projection over the grid, wherein applying the projection includes solving for pressure and correcting the intermediate grid velocities to projected grid velocities using the pressure, and wherein the projection discretizes dilational forces, including at least one of mean volumetric and spherical forces, that affect the material using the dilational component of the constitutive model, and updating the states of one or more of the particles based on at least the projected grid velocities; and rendering one or more images depicting the material using at least the updated states of the one or more of the particles at the plurality of time steps.

2. The computer-implemented method of claim 1, wherein:

the two states of the material include a solid state and a liquid state; and the constitutive model is chosen based on whether the material is in the solid state or the liquid state.

3. The computer-implemented method of claim 2, wherein:

when the material is in the liquid state, the deviatoric component of the constitutive model is equal to zero; and when the material is in the solid state, the deviatoric component of the constitutive model is not equal to zero.

4. The computer-implemented method of claim 1, wherein the states of the particles include temperatures and phases of the particles, and wherein the method further comprises, for each of the plurality of time steps:

solving a heat equation on the grid to obtain updated temperatures; and updating the temperatures and phases of the particles based on at least the updated temperatures.

5. The computer-implemented method of claim 4, wherein properties of the material including Young's modulus and Poisson ratio are varied based on at least the temperatures of the particles.

6. The computer-implemented method of claim 4, further comprising:

when a temperature of a given particle is equal to a phase transition temperature, adding a heat value to a buffer unless the buffer has reached a predefined latent heat value associated with the phase transition; and when the buffer has reached the predefined latent heat value, changing a phase of the given particle.

7. The computer-implemented method of claim 1, wherein the grid is a marker-and-cell (MAC) grid.

8. The computer-implemented method of claim 7, wherein transferring the states of the particles to the grid includes mass weighted rasterization of properties of the particles at cell centers and faces of the MAC grid.

9. The computer-implemented method of claim 7, further comprising:

flagging faces of cells of the MAC grid as colliding if a level set computed by a collision object is negative at centers of the faces;

classifying the cells of the MAC grid as empty, colliding, or interior, wherein a given cell is classified as colliding if faces surrounding the given cell are colliding, wherein a given cell is classified as interior if the given cell and faces surrounding the given cell have mass, and wherein remaining cells that are not colliding or interior are classified as empty; and correcting velocities in the intermediate grid velocities for collisions based on at least the classifications of the cells.

10. A non-transitory computer-readable storage medium storing a program, which, when executed by a processor performs operations for simulating and rendering a material while avoiding material point method locking, the operations comprising:

for each of a plurality of time steps of a simulation of the material undergoing a phase transition between two states of the material:

transferring states of particles representing the material to a grid, determining intermediate grid velocities using a material point method computation, wherein the material point method computation discretizes deviatoric forces, including shear forces, that affect the material using a deviatoric component of a constitutive model, the constitutive model dictating forces that affect the material and splitting into the deviatoric component and a dilational component, applying a projection over the grid, wherein applying the projection includes solving for pressure and correcting the intermediate grid velocities to projected grid velocities using the pressure, and wherein the projection discretizes dilational forces, including at least one of mean volumetric and spherical forces, that affect the material using the dilational component of the constitutive model, and updating the states of one or more of the particles based on at least the projected grid velocities; and rendering one or more images depicting the material using at least the updated states of the one or more of the particles at the plurality of time steps.

11. The computer-readable storage medium of claim 10, wherein:

the two states of the material include a solid state and a liquid state; and the constitutive model is chosen based on whether the material is in the solid state or the liquid state.

12. The computer-readable storage medium of claim 11, wherein:

when the material is in the liquid state, the deviatoric component of the constitutive model is equal to zero; and when the material is in the solid state, the deviatoric component of the constitutive model is not equal to zero.

13. The computer-readable storage medium of claim 10, wherein the states of the particles include temperatures of the particles and phases of the particles, the operations further comprising, for each of the plurality of time steps:

solving a heat equation on the grid to obtain updated temperatures; and updating the temperatures and phases of the particles based on at least the updated temperatures.

14. The computer-readable storage medium of claim 13, wherein properties of the material including Young's modulus and Poisson ratio are varied based at least on the temperatures of the particles.

15. The computer-readable storage medium of claim 13, the operations further comprising:

when a temperature of a given particle is equal to a phase transition temperature, adding a heat value to a buffer unless the buffer has reached a predefined latent heat value associated with the phase transition; and when the buffer has reached the predefined latent heat value, changing a phase of the given particle.

16. The computer-readable storage medium of claim 10, wherein the grid is a marker-and-cell (MAC) grid, and wherein transferring the states of the particles to the grid includes mass weighted rasterization of properties of the particles at cell centers and faces of the MAC grid.

17. The computer-readable storage medium of claim 16, the operations further comprising:

flagging faces of cells of the MAC grid as colliding if a level set computed by a collision object is negative at centers of the faces;

classifying the cells of the MAC grid as empty, colliding, or interior, wherein a given cell is classified as colliding if faces surrounding the given cell are colliding, wherein a given cell is classified as interior if the given cell and faces surrounding the given cell have mass, and wherein remaining cells that are not colliding or interior are classified as empty; and correcting velocities in the intermediate grid velocities for collisions based on at least the classifications of the cells.

18. A system, comprising:

a processor; and a memory, wherein the memory includes an application program configured to perform operations for simulating and rendering a material while avoiding material point method locking, the operations comprising:

for each of a plurality of time steps of a simulation of the material undergoing a phase transition between two states of the material:

transferring states of particles representing the material to a grid, determining intermediate grid velocities using a material point method computation, wherein the material point method computation discretizes deviatoric forces, including shear forces, that affect the material using a deviatoric component of a constitutive model, the constitutive model dictating forces that affect the material and splitting into the deviatoric component and a dilational component;

applying a projection over the grid, wherein applying the projection includes solving for pressure and correcting the intermediate grid velocities to projected grid velocities using the pressure, and wherein the projection discretizes dilational forces, including at least one of mean volumetric and spherical forces, that affect the material using the dilational component of the constitutive model; and updating the states of one or more of the particles based on at least the projected grid velocities, and rendering one or more images depicting the material using at least the updated states of the one or more of the particles at the plurality of time steps.

* * * * *

UNITED STATES PATENT AND TRADEMARK OFFICE
CERTIFICATE OF CORRECTION

PATENT NO. : 10,210,287 B2  
APPLICATION NO. : 14/323798  
DATED : February 19, 2019  
INVENTOR(S) : Andrew Selle et al.

Page 1 of 1

It is certified that error appears in the above-identified patent and that said Letters Patent is hereby corrected as shown below:

In the Specification

In Column 3, Line 45, delete "$v_p$" and insert -- $v_p$ --, therefor.

In Column 3, Line 53, delete "$k_p$" and insert -- $\kappa_p$ --, therefor.

In Column 10, Line 39, delete "deviator/dilational" and insert -- deviatoric/dilational --, therefor.

In Column 10, Line 66, delete "$\Phi_\mu(\hat{x}) = \Sigma_p V_p^0 \hat{\Psi}_\mu(\hat{F}_{Ep}(\hat{x}))$," and insert -- $\Phi_\mu(\hat{x}) = \sum_p V_p^0 \hat{\Psi}_\mu(\hat{F}_{Ep}(\hat{x}))$, --, therefor.

In Column 11, Line 56, delete "δu$_i$)." and insert -- δu$_j$). --, therefor.

In Column 12, Line 25, delete "$\delta r_c = \frac{\delta p_c J_{Pc}^n}{J_{Ec}^n \lambda_c^n \Delta t} + \Delta t \Sigma_i \Sigma_{c'} \frac{1}{\rho_i^n} G_{ic} G_{ic'} \delta p_{c'}$ and $\rho_i^n = \frac{m_i^n}{v_i^n}$" and insert -- $\delta r_c = -\frac{\delta p_c J_{Pc}^n}{J_{Ec}^n \lambda_c^n \Delta t} + \Delta t \sum_i \sum_{c'} \frac{1}{\rho_i^n} G_{ic} G_{ic'} \delta p_{c'}$ and $\rho_i^n = \frac{m_i^n}{v_i^n}$ --, therefor.

In the Claims

In Column 20, Line 5, in Claim 18, delete "grid," and insert -- grid; --, therefor.

Signed and Sealed this  
Twenty-third Day of April, 2019

Andrei Iancu  
*Director of the United States Patent and Trademark Office*